(12) United States Patent
Taylor

(10) Patent No.: US 6,233,440 B1
(45) Date of Patent: May 15, 2001

(54) RF POWER AMPLIFIER WITH VARIABLE BIAS CURRENT

(75) Inventor: Stewart S. Taylor, Beaverton, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 09/129,979

(22) Filed: Aug. 5, 1998

(51) Int. Cl.[7] .............. H04B 1/04; H04B 1/38; H03F 3/04
(52) U.S. Cl. .......... 455/127; 455/575; 455/571; 330/296
(58) Field of Search .............. 455/575, 572, 455/127, 571; 330/296

(56) References Cited

U.S. PATENT DOCUMENTS

| | | | |
|---|---|---|---|
| 3,831,093 | * 8/1974 | Walker | 325/56 |
| 4,010,327 | * 3/1977 | Kobrinetz | 179/41 |
| 4,185,242 | * 1/1980 | Schaible | 325/363 |
| 4,268,797 | 5/1981 | Buck et al. | 330/277 |
| 4,317,083 | 2/1982 | Boyd | 330/296 |
| 4,893,347 | * 1/1990 | Eastmond et al. | 455/52 |

FOREIGN PATENT DOCUMENTS

| | | | |
|---|---|---|---|
| 0 854 569 | 7/1998 | (EP) | H03F/1/02 |
| WO 94/23491 | 10/1994 | (WO) | H03F/1/30 |
| WO 98/00912 | 1/1998 | (WO) | H03F/3/68 |

* cited by examiner

Primary Examiner—William G. Trost
Assistant Examiner—Sheila Smith
(74) Attorney, Agent, or Firm—Skjerven Morrill MacPherson LLP; Brian D. Ogonowsky; Daniel P. Stewart

(57) ABSTRACT

An RF power amplifier with variable bias current is disclosed. The RF amplifier includes a peak detector that detects the peak level of the amplifier input signal. The peak detector generates an output signal in response to the peak level of the amplifier input signal. A bias voltage level setting circuit coupled to the peak detector receives the peak detector output signal and generates a bias voltage in response to the peak detector output signal. An amplifier circuit coupled to the bias voltage level setting circuit receives the bias voltage and the amplifier input signal, and generates an output signal in response to the bias voltage and the amplifier input signal. The disclosed RF amplifier allows amplification of RF signals with high linearity and high efficiency at varying power levels, and extends the maximum power capability of the amplifier.

12 Claims, 4 Drawing Sheets

RF POWER AMPLIFIER WITH VARIABLE BIAS CURRENT

TECHNICAL FIELD OF THE INVENTION

The present invention relates to RF signal processing, and in particular to an RF power amplifier with variable bias current.

BACKGROUND OF THE INVENTION

In cellular telephones and other communication devices, radio frequency (RF) power amplifiers are typically used to amplify RF signals prior to transmission. These RF power amplifiers typically generate an output power in the range of 50 mW to 3 watts. In such devices, linear amplification is desired to prevent signal distortion. Efficiency is also a consideration, especially for mobile devices such as cellular telephones, due to the limited quantity of energy stored in the accompanying battery.

Efficiency and linearity are often competing considerations. When high efficiency is important, a low amplifier transistor bias current is chosen, thereby increasing battery life and talk time. This generally results in acceptable distortion at low to moderate power levels, but creates unacceptable distortion at high power levels. When high linearity is important, a larger transistor bias current is chosen, reducing distortion to an acceptable level even at high power levels. The high bias current may also be required to obtain the maximum output power from the amplifier output transistor. However, the high bias current reduces battery life and talk time, particularly at low power levels.

SUMMARY OF THE INVENTION

Therefore, a need has arisen for an RF power amplifier that addresses the disadvantages and deficiencies of the prior art. In particular, a need has arisen for an RF power amplifier with high efficiency and high linearity at varying power levels without the need for external adjustment.

Accordingly, an RF power amplifier with variable bias current is disclosed. In one embodiment, the RF amplifier includes a peak detector that detects the peak level of the amplifier input signal. The peak detector generates an output signal in response to the peak level of the amplifier input signal. A bias voltage level setting circuit coupled to the peak detector receives the peak detector output signal and generates a bias voltage in response to the peak detector output signal. An amplifier circuit coupled to the bias voltage level setting circuit receives the bias voltage and the amplifier input signal, and generates an output signal in response to the bias voltage and the amplifier input signal.

A technical advantage of the present invention is that amplification of RF signals may be obtained with high linearity at varying power levels. Another technical advantage of the present invention is that high linearity may be attained while maintaining low bias current and high efficiency at varying power levels. Yet another technical advantage of the present invention is that high maximum output power may be obtained with high efficiency.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 4 of the drawings. Like numerals are used for like and corresponding parts of the various drawings.

Figure 1:
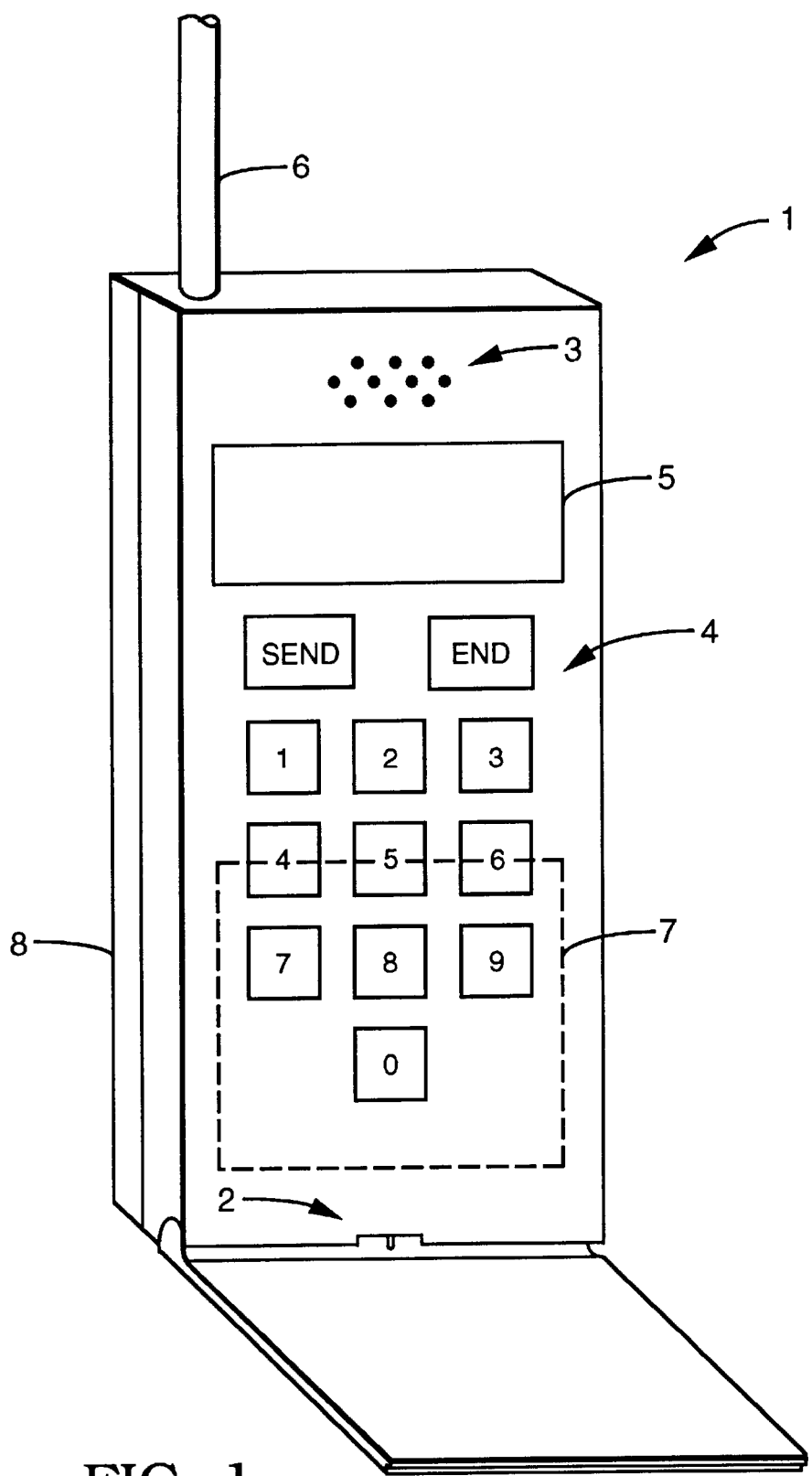
FIG. 1 is a simplified perspective view of a mobile telephone constructed in accordance with the present invention.

Referring to FIG. 1, a mobile telephone 1 constructed in accordance with the present invention is shown. Mobile telephone 1 has a microphone 2, a speaker 3, a keypad 4, a display screen 5, and a radio frequency (RF) antenna 6 for sending and receiving signals from a station such as a cell tower (not shown). Mobile telephone 1 also has internal circuitry 7 powered by a battery 8. Mobile telephone 1 may be compliant with a signal frequency and modulation standard such as AMPS, PCS, GSM, CDMA, TDMA, DCS 1800 or some other telecommunications standard.

Internal circuitry 7 is coupled to speaker 3 and microphone 2 for communicating with a user. Internal circuitry 7 is also coupled to keypad 4 to receive information regarding keypad entries made by the user. Internal circuitry 7 is also coupled to RF antenna 6 to send and receive identification signals, voice signals, keypad entries and other information to and from the station.

Internal circuitry 7 communicates with the station via RF signals transmitted through the atmosphere. To generate RF signals, internal circuitry 7 includes one or more RF power amplifiers (not shown in FIG. 1) capable of amplifying RF signals.

Figure 2:
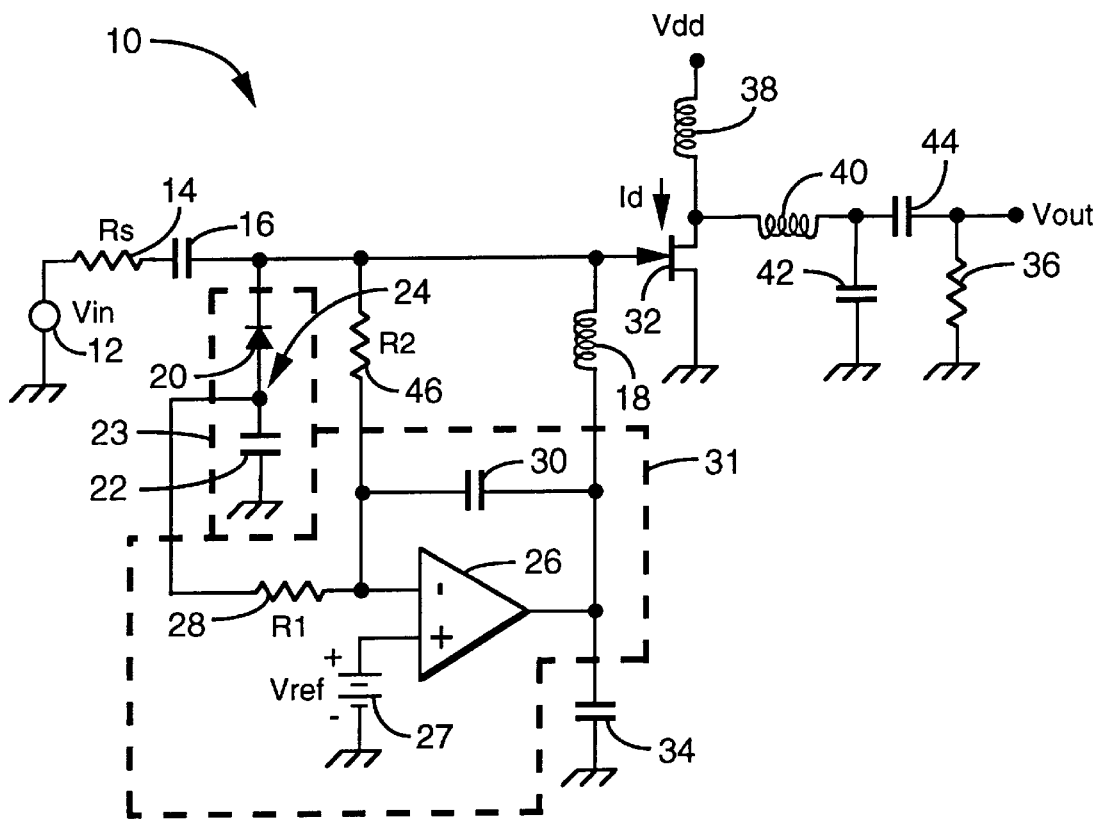
FIG. 2 is a schematic diagram of an RF power amplifier constructed in accordance with one embodiment of the present invention.

Referring to FIG. 2, an RF power amplifier 10 for use in internal circuitry 7 of mobile telephone 1 or in other RF devices is shown. RF power amplifier 10 has a variable bias current, as will be described more fully below. RF power amplifier 10 is preferably implemented in a GaAs MESFET technology, but may also be implemented in a Si MOSFET, Si bipolar, GaAs HBT or some other technology.

An input signal $V_{in}$ is provided to RF power amplifier 10 by an input signal source 12 with a source impedance $R_s$ represented by resistor 14. Input signal source 12 is coupled to a DC blocking capacitor 16. Capacitor 16 may also form an input impedance matching network with an inductor 18. Thus, capacitor 16 and inductor 18 together may provide an input impedance which preferably matches the source impedance $R_s$ of input signal source 12 to the input impedance of an amplifier transistor 32, which will be described more fully below. This match may be for maximum gain, maximum output power, best linearity, or some combination of these parameters.

A diode 20 has a cathode connected to one terminal of capacitor 16 and an anode connected to one terminal of a holding capacitor 22. The other terminal of holding capacitor 22 is grounded. Together, diode 20 and holding capacitor 22 form a negative peak detector 23. The most negative voltage seen at the cathode of diode 20 (plus a diode drop) is held by holding capacitor 22 at node 24, between holding capacitor 22 and diode 20.

The voltage at node 24 ($V_{24}$) is provided to a low-pass feedback amplifier 31 formed by control amplifier 26, resistor 28 and capacitor 30. Resistor 28 has a resistance $R_1$ and is connected between node 24 and the negative input terminal of control amplifier 26. Capacitor 30 is connected between the output terminal and the negative input terminal of control amplifier 26. Control amplifier 26 may be an operational amplifier or some other amplifier with a gain preferably no less than 10. A positive reference voltage $V_{ref}$ is provided to the positive input terminal of control amplifier 26 by a voltage source 27.

In this configuration, control amplifier 26, together with resistor 28 and capacitor 30, acts as an integrator that integrates ($V_{24}-V_{ref}$) over time. Thus, if $V_{24}$ is less than $V_{ref}$, the output of control amplifier 26 will increase. Similarly, if $V_{24}$ is greater than $V_{ref}$, the output of control amplifier 26 will decrease. For reasons which will become apparent, the response time of low-pass feedback amplifier 31, as determined by the relative sizes of capacitors 22 and 30 and resistor 28, is preferably at a rate that is slower than the modulating baseband signal.

The output of control amplifier 26 provides a bias voltage to the gate of a transistor 32. Thus, AC signals received from signal source 12 via capacitor 16 are added to the quasi-constant bias voltage generated by control amplifier 26. The response time of low-pass feedback amplifier 31 is preferably at a rate that is slower than the modulating baseband signal so that the bias voltage created by low-pass feedback amplifier 31 does not unduly distort the envelope of the RF signal provided to transistor 32. Inductor 18, connected between the gate of transistor 32 and the output of control amplifier 26, and an RF bypass capacitor 34, connected between the output of control amplifier 26 and ground, prevent the RF signal from signal source 12 from affecting the function of low-pass feedback amplifier 31.

Transistor 32 can be modeled as a transconductance amplifier with a threshold voltage $V_t$. Thus, when the gate voltage ($V_{gs}$) is higher than $V_t$, transistor 32 conducts a drain current ($I_d$) proportional to a function of $V_{gs}-V_t$, specifically $(V_{gs}-V_t)^q$, where $1<q<3$. When $V_{gs}<V_t$, $I_d\approx 0$. The drain current $I_d$ is converted to an output voltage $V_{out}$ by a load resistor 36. An inductor 38 acts as an RF choke. An inductor 40 and capacitor 42 form an output impedance matching network. Capacitor 44 acts as a DC blocking capacitor.

The bias voltage supplied to the gate of transistor 32 determines the quiescent drain current $I_d$ conducted by transistor 32 and affects the average transistor current under conditions of RF drive. In previous RF power amplifier circuits, a constant bias voltage, typically greater than the threshold voltage $V_t$ of the amplifier transistor, was provided to the amplifier transistor. The constant bias voltage was typically preselected by the circuit designer as a compromise between efficiency, linearity and maximum output power. Thus, if the biasing of the amplifier transistor was such that the minimum $V_{gs}$ was approximately equal to $V_t$, then drain current $I_d$ would be cut off at each downswing of $V_{gs}$. Such an amplifier is referred to as a Class B amplifier. In this situation, some distortion is usually introduced into the output voltage $V_{out}$. In CDMA and TDMA environments, this distortion may result in spectral regrowth, causing loss of information and spillover into adjacent channels. Conversely, if a high bias voltage was selected to prevent clipping of the drain current waveform, linearity and/or maximum output power may be improved but a greater average drain current would result, decreasing battery life and talk time.

Figure 3:
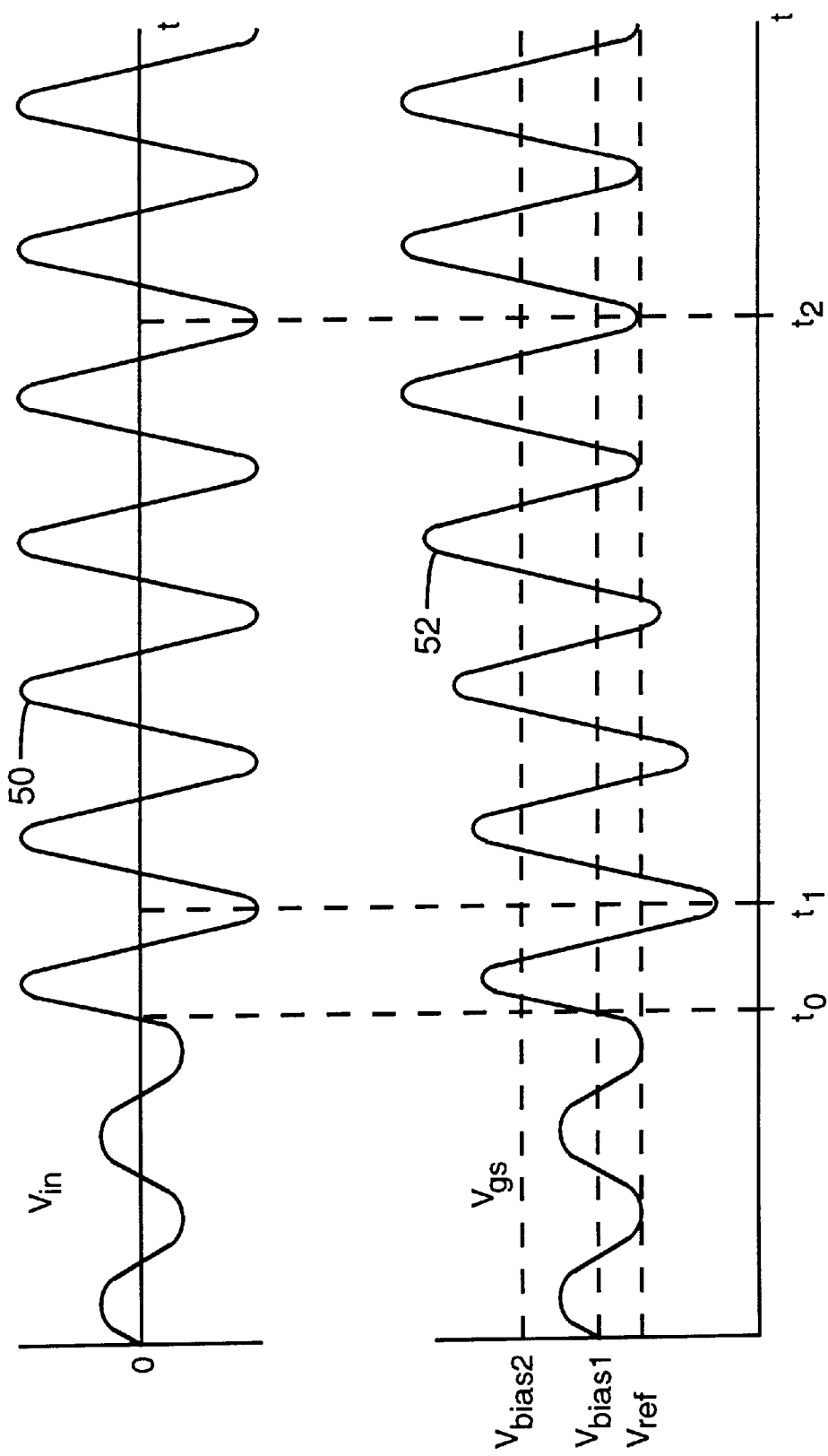
FIG. 3 is a graph illustrating waveforms in the RF power amplifier.

In RF power amplifier 10, a variable bias voltage is produced by low-pass feedback amplifier 31. The operation of RF power amplifier 10 is illustrated in FIG. 3, in which a waveform 50 of input voltage $V_{in}$ and a corresponding waveform 52 of gate voltage $V_{gs}$ are shown. In FIG. 3, it is assumed for purposes of illustration that an optional resistor 46 in RF power amplifier 10 has an infinite resistance, or in other words that resistor 46 is absent from RF power amplifier 10. The effect of resistor 46 will be described more fully below.

As shown in FIG. 3, input voltage $V_{in}$ initially has a sinusoidal waveform with a first amplitude. A bias voltage $V_{bias1}$ is produced by low-pass feedback amplifier 31 so that $V_{gs}$ does not fall below $V_{ref}$. At time $t_0$, the amplitude of $V_{in}$ increases. This increase in amplitude is also seen in $V_{gs}$. At time $t_1$, peak detector 23 detects a minimum $V_{gs}$ below $V_{ref}$. This imbalance between the minimum $V_{gs}$ and $V_{ref}$ causes low-pass feedback amplifier 31 to increase the bias voltage applied to the gate of transistor 32. Over time, the bias voltage is increased until, at time $t_2$, a bias voltage $V_{bias2}$ is reached such that the minimum $V_{gs}$ detected by peak detector 23 is equal to $V_{ref}$. This bias level $V_{bias2}$ is maintained so long as the amplitude of $V_{in}$ remains constant. If the amplitude of $V_{in}$ later increases or decreases, low-pass feedback amplifier 31 will increase or decrease the bias voltage accordingly.

Reference voltage $V_{ref}$ is preferably chosen to be greater than or approximately equal to the threshold voltage $V_t$ of transistor 32. Thus, at any constant power level, amplifier 10 acts as a Class A amplifier, with no cutoff of drain current $I_d$. Class B operation occurs only on a temporary basis immediately following an increase in power level, before a new bias voltage level has been attained by low-pass feedback amplifier 31. Low-pass feedback amplifier 31 preferably has a response time that is slower than the modulating baseband signal, so that the adjustment of bias voltage level by low-pass feedback amplifier 31 does not unduly distort the envelope of the gate voltage waveform.

Referring again to FIG. 2, an optional resistor 46 with a resistance $R_2$ is connected between the negative input of control amplifier 26 and the gate of transistor 32. In the foregoing description of the operation of RF power amplifier 10, it was assumed that resistor 46 was not present, i.e. that $R_2=\infty$. With resistor 46 present, the behavior of low-pass feedback amplifier 31 under constant input power conditions can be approximated by the following equation:

$$V_{min}=V_{ref}-V_p R_1/(R_1+R_2) \qquad (1)$$

In equation (1), $V_{min}$ is the minimum gate voltage $V_{gs}$ detected by peak detector 23 and $V_p$ is the peak amplitude of the input voltage $V_{in}$.

Thus, for the ideal case previously discussed, in which $R_2=\infty$, $V_{min}=V_{ref}$. In other words, the steady-state minimum $V_{gs}$ will be equal to $V_{ref}$, as illustrated in FIG. 3. If $R_1=\infty$, so that low-pass feedback amplifier 31 is isolated from peak detector 23, then a constant bias voltage equal to $V_{ref}$ is produced, so that $V_{min}=V_{ref}-V_p$. This is similar to a typical Class B or other constant-bias amplifier.

If both $R_1$ and $R_2$ are finite, then, according to equation (1), the bias voltage produced by low-pass feedback amplifier 31 produces a bias condition somewhere between Class A operation (with no drain current cutoff) and Class B operation. This mode of operation, referred to a "Class A/B" operation, typically results in improved linearity or efficiency compared to Class A or Class B operation. Thus, some drain current cutoff may occur at high input power, but less drain current is used, resulting in longer battery life and talk time. The circuit designer may therefore select $R_1$ and $R_2$ to achieve more optimum performance or a compromise between efficiency and linearity, with the resulting compromise giving acceptable efficiency and linearity over a greater range of input power than could be attained with a constant-bias amplifier.

In RF power amplifier 10, when diode 20 conducts a current, there is a temperature-dependent voltage drop across the diode. Ideally, peak detector 23 detects the minimum $V_{gs}$ seen at the gate of transistor 32. However, the voltage drop across diode 20 creates an offset between $V_{24}$ and the minimum $V_{gs}$. Furthermore, because the voltage drop across diode 20 is dependent on diode temperature, the offset between $V_{24}$ and the minimum $V_{gs}$ is dependent on the ambient temperature experienced by RF power amplifier 10. This temperature effect on the performance of RF power amplifier 10 is undesirable.

Figure 4:
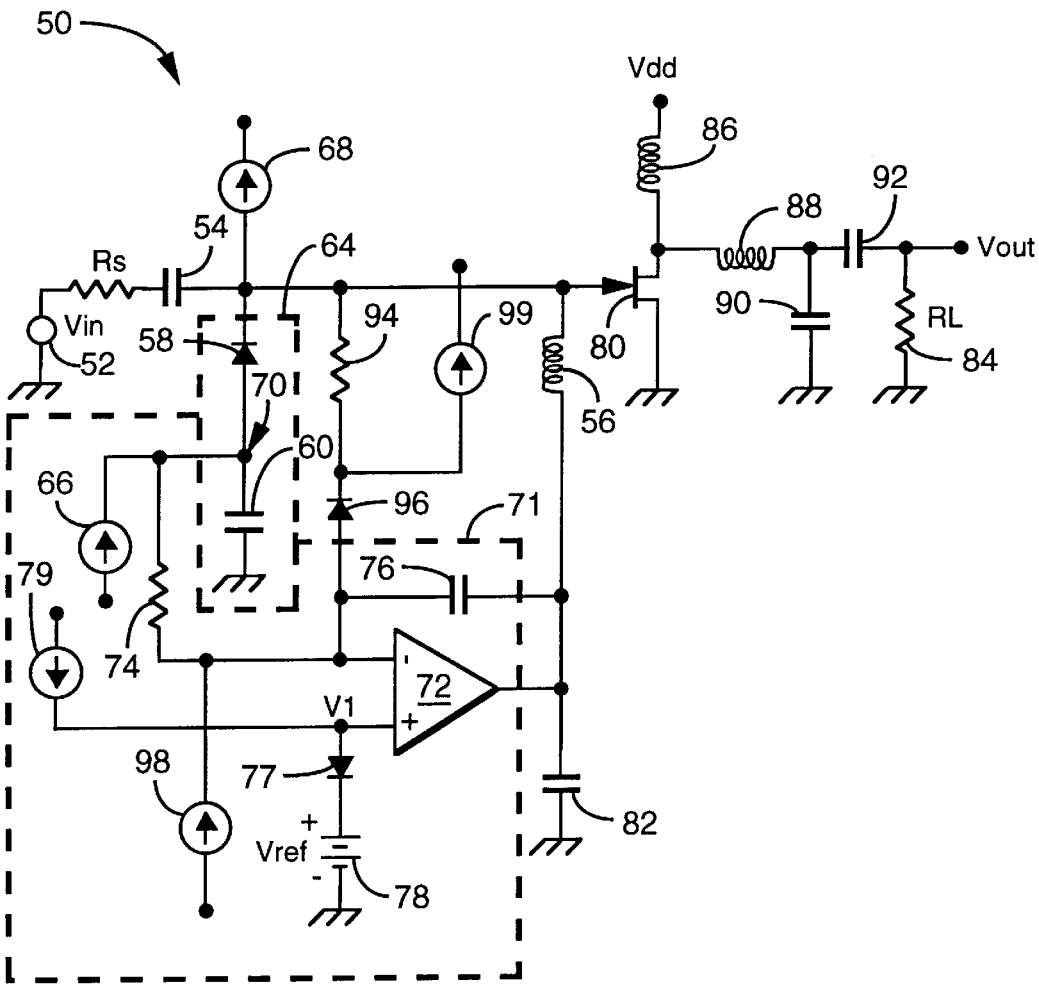
FIG. 4 is a schematic diagram of an alternative RF power amplifier constructed in accordance with one embodiment of the present invention.

Thus, referring to FIG. 4, an alternative RF power amplifier 50 with variable bias current is shown. RF power amplifier 50 operates in a manner similar to RF power amplifier 10, but reduces or eliminates the aforementioned disadvantages of RF power amplifier 10. Like RF power amplifier 10, RF power amplifier 50 receives an input signal $V_{in}$ with a source impedance $R_s$ from an input signal source 52 via a DC blocking capacitor 54. Capacitor 54 also forms an input impedance matching network with an inductor 56. Thus, capacitor 54 and inductor 56 together provide an input impedance which preferably matches the source impedance $R_s$ of input signal source 52 to the input impedance of amplifying transistor 80 in a desired way.

A diode 58 and holding capacitor 60 form a negative peak detector 64. Unlike peak detector 23 of RF power amplifier 10, peak detector 64 holds a closer approximation of the most negative voltage seen at the cathode of diode 58 with a substantially reduced diode drop. This is because current sources 66 and 68 each conduct a small current so as to set diode 58 at the edge of conduction. Thus, the most negative voltage seen at the cathode of diode 58 is held by holding capacitor 60 at node 70 between holding capacitor 60 and diode 58.

The voltage at node 70 ($V_{70}$) is provided to a low-pass feedback amplifier 71 formed by control amplifier 72, resistor 74 and capacitor 76. A positive reference voltage $V_1$ is provided to the positive input terminal of control amplifier 72 by a voltage source 78. Low-pass feedback amplifier 71 integrates ($V_{70}-V_1$) over time. Thus, if $V_{70}$ is less than $V_1$, the output of control amplifier 72 will increase. Similarly, if $V_{70}$ is greater than $V_1$, the output of control amplifier 72 will decrease.

A diode 77 connected between voltage source 78 and the positive input terminal of control amplifier 72 is set at the edge of conduction by a current source 79. Diode 77 preferably has temperature-dependent characteristics similar to those of diode 58. Thus, because each input of control amplifier 72 is similarly affected by temperature variations, the performance of low-pass feedback amplifier 71 is largely temperature-independent.

Similarly, a diode 96 is connected between resistor 94 and the negative input of control amplifier 72. Diode 96 is set at the edge of conduction by current sources 98 and 99. Diode 96, which preferably has temperature characteristics similar to those of diode 58, compensates for the temperature dependence of diode 58. Diode 96, together with diode 77, make equation (1) a better approximation of the behavior of low-pass feedback amplifier 71.

The output of control amplifier 72 provides a bias voltage to the gate of a transistor 80 and is isolated at RF frequencies. Thus, AC signals received from signal source 52 via capacitor 54 are added to the quasi-constant bias voltage produced by control amplifier 72. The response time of low-pass feedback amplifier 71 is preferably at a rate that is slower than the modulating baseband signal so that the bias voltage created by low-pass feedback amplifier 71 does not unduly distort the envelope of the RF signal provided to transistor 80. Inductor 56, connected between the gate of transistor 80 and the output of control amplifier 72, and an RF bypass capacitor 82, connected between the output of control amplifier 72 and ground, prevent the RF signal from signal source 52 from affecting the function of low-pass feedback amplifier 71.

Transistor 80 can be modeled as a transconductance amplifier with a threshold voltage $V_t$ and an appropriate output impedance. Thus, when the gate voltage ($V_{gs}$) is higher than $V_t$, transistor 80 conducts a drain current ($I_d$) proportional to a function of $V_{gs}-V_t$. When $V_{gs}<V_t$, $I_d=0$. The drain current $I_d$ is converted to an output voltage $V_{out}$ by a load resistor 84. An inductor 86 acts as an RF choke. An inductor 88 and capacitor 90 form an output impedance matching network. Capacitor 92 acts as a DC blocking capacitor.

One preferred mode of operations involves setting reference voltage $V_{ref}$ to be greater than or approximately equal to the threshold voltage $V_t$ of transistor 80. Thus, at any constant power level, amplifier 50 acts approximately as a Class A amplifier, with no cutoff of drain current $I_d$. As previously discussed with respect to FIG. 3, Class B operation occurs only on a temporary basis immediately following an increase in power level, before a new bias voltage level has been attained by low-pass feedback amplifier 71. However, low-pass feedback amplifier 71 preferably has a response time that is slower than the modulating baseband signal, so that the adjustment of bias voltage level by low-pass feedback amplifier 71 does not unduly distort the waveform of the gate voltage $V_{gs}$.

An optional resistor 94 with a resistance $R_2$ is coupled between the negative input of control amplifier 72 and the gate of transistor 80. With resistor 94 present, the behavior of low-pass feedback amplifier 71 under constant input power conditions can be approximated by equation (1) as previously discussed.

If both $R_1$ and $R_2$ are finite, then, according to equation (1), the bias voltage produced by low-pass feedback amplifier 71 results in Class A/B operation. The exact choice of $R_1$ and $R_2$, along with the choice of output impedance, is generally made to achieve a satisfactory combination of efficiency, linearity and maximum output power.

Although the present invention and its advantages have been described in detail, it should be understood that various changes, substitutions, and alterations can be made therein without departing from the spirit and scope of the invention as defined by the appended claims.

I claim:

1. An amplifier comprising:

a peak detector operable to detect a peak level of an amplifier input signal, and operable to generate an output signal in response to the peak level of the amplifier input signal;

a bias voltage level setting circuit coupled to the peak detector, the bias voltage level setting circuit being operable to receive the output signal from the peak detector, and operable to generate a bias voltage in response to the output signal from the peak detector; and an amplifier circuit coupled to the bias voltage level setting circuit, the amplifier circuit being operable to receive the bias voltage from the bias voltage level setting circuit, and operable to receive the amplifier input signal, and operable to generate an output signal in response to the bias voltage and the amplifier input signal;

wherein the peak detector comprises a negative peak detector operable to detect a negative peak level of the amplifier input signal.

2. The amplifier of claim 1, wherein the peak detector comprises a diode and a holding capacitor, the diode having a cathode connected to an amplifier input line, the diode further having an anode connected to a peak detector output node, the holding capacitor having a first terminal connected to the peak detector output node and a second terminal connected to a reference voltage source.

3. An RF power amplifier comprising:

a negative peak detector operable to detect a negative peak level of an amplifier input signal, and operable to generate an output signal in response to the negative peak level of the amplifier input signal;

an integrator coupled to the peak detector in a negative feedback loop, the integrator being operable to receive the output signal from the peak detector, and operable to integrate a difference between a reference voltage and the output signal from the peak detector to generate a bias voltage; and a transconductance amplifier coupled to the integrator, the transconductance amplifier being operable to receive the bias voltage from the integrator, and operable to receive the amplifier input signal, and operable to generate a current in response to the bias voltage and the amplifier input signal; and a load impedance coupled to the transconductance amplifier, the load impedance being operable to conduct the current generated by the transconductance amplifier, and operable to generate an output voltage in response to the current generated by the transconductance amplifier.

4. A mobile telephone comprising:

a microphone;

a speaker;

an antenna operable to transmit and receive broadcast electromagnetic signals;

internal circuitry coupled to the microphone and operable to receive voice signals from the microphone, the internal circuitry being coupled to the speaker and operable to transmit voice signals to the speaker, the internal circuitry being coupled to the antenna and operable to transmit and receive AC signals to and from the antenna, the internal circuitry including an amplifier operable to amplify at least one of the AC signals, the amplifier having a peak detector operable to detect a peak level of an amplifier input signal, the peak detector being operable to generate an output signal in response to the peak level of the amplifier input signal, the amplifier further having a bias voltage level setting circuit coupled to the peak detector, the bias voltage level setting circuit being operable to receive the output signal from the peak detector and operable to generate a bias voltage in response to the output signal from the peak detector, the amplifier further having an amplifier circuit coupled to the bias voltage level setting circuit, the amplifier circuit being operable to receive the bias voltage from the bias voltage level setting circuit, and operable to receive the amplifier input signal, and operable to generate an output signal in response to the bias voltage and the amplifier input signal.

5. The mobile telephone of claim 4, wherein the amplifier circuit comprises a transconductance amplifier, and wherein the output signal of the amplifier circuit comprises an output current.

6. The mobile telephone of claim 5, wherein the amplifier circuit further comprises a load impedance coupled to the transconductance amplifier, the load impedance being operable to conduct the output current generated by the transconductance amplifier, and operable to generate an output voltage in response to the output current generated by the transconductance amplifier.

7. The mobile telephone of claim 5, wherein the transconductance amplifier comprises a transistor having a first terminal coupled to the bias voltage level setting circuit, the transistor having a second terminal coupled to an impedance, the impedance being further coupled to a first voltage source, the transistor having a third terminal coupled to a second voltage source.

8. The mobile telephone of claim 4, wherein the bias voltage level setting circuit comprises an integrator operable to integrate a difference between a reference voltage and the output signal from the peak detector to generate the bias voltage.

9. The mobile telephone of claim 4, wherein the peak detector comprises a negative peak detector operable to detect a negative peak level of the amplifier input signal.

10. The mobile telephone of claim 9, wherein the bias voltage level setting circuit is operable to receive a reference voltage from a reference voltage source, and operable to generate the bias voltage such that a sum of the bias voltage and the negative peak level of the amplifier input signal is approximately equal to the reference voltage.

11. The mobile telephone of claim 9, wherein the peak detector comprises a diode and a holding capacitor, the diode having a cathode connected to an amplifier input line, the diode further having an anode connected to a peak detector output node, the holding capacitor having a first terminal connected to the peak detector output node and a second terminal connected to a reference voltage source.

12. The mobile telephone of claim 4, wherein the bias voltage level setting circuit comprises:

a resistor having first and second terminals, the first terminal being connected to an output node of the peak detector;

a control amplifier having positive and negative input terminals and an output terminal, the negative input terminal being connected to the second terminal of the resistor, the positive input terminal being connected to a reference voltage source and receiving a reference voltage from the reference voltage source; and a capacitor having first and second terminals, the first terminal being connected to the negative input terminal of the control amplifier, the second terminal being connected to the output terminal of the control amplifier.

* * * * *